United States Patent [19]

Mendolia

[11] Patent Number: 5,798,638
[45] Date of Patent: Aug. 25, 1998

[54] APPARATUS FOR TESTING OF PRINTED CIRCUIT BOARDS

[75] Inventor: Gregory S. Mendolia, Forest, Va.

[73] Assignee: Ericsson, Inc., Research Triangle Park, N.C.

[21] Appl. No.: 736,573

[22] Filed: Oct. 24, 1996

[51] Int. Cl.⁶ .................................................. G01R 31/02
[52] U.S. Cl. ...................................... 324/158.1; 438/15
[58] Field of Search .............................. 324/158.1, 754, 324/760–763; 361/748; 174/250, 254; 29/426.1, 426.2, 426.5; 438/14, 15, 17, 18

[56] References Cited

U.S. PATENT DOCUMENTS 5,047,711  9/1991  Smith et al. ........................ 324/760
5,140,745  8/1992  McKenzie, Jr. ................... 361/748
5,162,729  11/1992  Lusby ............................... 324/766

*Primary Examiner*—Ernest F. Karlsen
*Assistant Examiner*—Anh Phung
*Attorney, Agent, or Firm*—Jenkens & Gilchrist

[57] ABSTRACT

An apparatus for testing of circuitry located on a printed circuit board without placing test point pads on the surface of the printed circuit boards as is currently done. Test point pads which are constructed of a conductive material are placed on the edge of a manufacturing panel holding the printed circuit boards in place during the manufacturing and testing process. The pressure point pads, when located on the edge of a manufacturing panel, do not face design pressures to reduce their size and number in an effort to preserve space as do pressure point pads which are located on the surface of printed circuit boards. The larger pressure point pads of the current invention are electrically connected to the test circuitry on the printed circuit board via router tabs. These router tabs are constructed of printed circuit board material and hold the printed circuit board attached to the manufacturing panel during the manufacturing and testing process.

2 Claims, 3 Drawing Sheets

APPARATUS FOR TESTING OF PRINTED CIRCUIT BOARDS

BACKGROUND OF THE INVENTION

1. Technical Field of the Invention

The present invention pertains in general to manufacturing test equipment, and more particularly, to the testing of printed circuit boards without the use of test point pads positioned on the surface of the printed circuit board.

2. Description of Related Art

Printed circuit boards (PCBs) manufactured for use in electronic equipment currently utilize test point pads positioned on the surface of the printed circuit board. Electrical contact with these surface mounted pads is made to test the printed circuit board assembly before it is removed from its manufacturing panel and assembled into the electronic equipment. The manufacturing panel is an extension of the printed circuit board and comprises a plurality of individual printed circuit boards which are ultimately cut away from the manufacturing panel at the end of the manufacturing and testing process. The individual printed circuit boards are partially routed out from the manufacturing panel along the perimeter of each printed circuit board with only a few router tabs remaining to hold the printed circuit boards to the manufacturing panel.

Test point pads for the printed circuit boards are currently located on the surface of the printed circuit board. Surface area on printed circuit boards is, however, becoming increasingly scarce as market pressures for smaller products containing more functionality continually reduce the available surface area on printed circuit boards while at the same time requiring additional components and circuit traces to be placed on the printed circuit board. Pressure to decrease the surface area while increasing the number of components and complexity of circuit traces correspondingly puts limits on the size and quantity of test point pads which can be placed on a printed circuit board.

A further problem deals with the flexibility of the manufacturing panel and the included printed circuit boards. Typically, components are mounted on both sides of a printed circuit board and access to both sides of the board is required. During the manufacturing and testing process, printed circuit boards traverse down a pair of conveyor rails which support only on the perimeter of the manufacturing panel. To facilitate connections to the test point pads during the testing process, a test fixture is lowered down on top of the printed circuit board in order that pressure pins which are part of the text fixture make electrical contact with the test point pads on the printed circuit board. Depending on the thickness of the printed circuit board, the printed circuit board flexes or bows downward in response to pressures exerted by the test fixture. Bowing or flexing of the printed circuit board causes pressure pins located near the center of the printed circuit board, where the bowing downward is most pronounced, to fail to make electrical contact with the test point pads. Since electrical contact has not been made with these test points, the printed circuit board fails the test procedure and requires further handling and testing thereby increasing the cost of the manufacturing process. This problem can be reduced using stand-offs on the opposite side of the printed circuit board at each test point. However, this doubles the requirement of board space needed for test points and counter pressure points.

A further problem associated with the current use of test point pads has to do with the design, fabrication, and debugging of the test fixture used to test the printed circuit boards. The location of the test point pads on a printed circuit board varies with the layout and design of the particular printed circuit board. With each new printed circuit board design, the test point pads can be located in different positions on the printed circuit board requiring the design, fabrication, and debugging of a new test fixture. Moreover, changes are frequently made to the layout of the printed circuit board late in the design cycle requiring the relocation of test point pads. This, in turn, results in a new test fixture having to be designed, fabricated, and tested. Not only is this costly, but it often puts product development schedules at risk especially if last minute problems force a printed circuit board redesign large enough to cause the test point pads to move.

Yet, another problem with placing test point pads on the surface of a printed circuit boards is that the size of these test point pads is continually being reduced to save scarce surface area on the printed circuit board. A reduction in the size of the test point pads on a printed circuit board, however, requires precise alignment of the test fixture in order to insure electrical contact between the pressure pins of the test fixture and the test point pads on the printed circuit board. Again, this increases the complexity of the manufacturing and testing process and increases the likelihood that an electrical contact between the pressure pins of the test fixture and the test point pads on the printed circuit board will not occur resulting in a failing test. It would be advantageous therefore, to devise an apparatus and method for providing test point pads which are not located on the printed circuit board, are large enough to eliminate alignment problems with the pressure pins of the test fixture, and which are not affected by the flexing or bowing of the printed circuit boards.

SUMMARY OF THE INVENTION

The present invention relocates pressure point pads currently located on the surface of printed circuit boards to the edge of a manufacturing panel which holds the printed circuit board in place during the manufacturing and testing process. The pressure point pads of the present invention are electrically connected to the circuitry located on the printed circuit board via electrical traces which are routed from the manufacturing panel to the printed circuit board through router tabs which physically maintain the printed circuit boards as part of the manufacturing panel. Preferably, the traces are positioned between subdivided layers of the printed circuit board on alternating layers to reduce the risk of shorting to one another or delaminating from the surface.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE DRAWINGS

Figure 1:
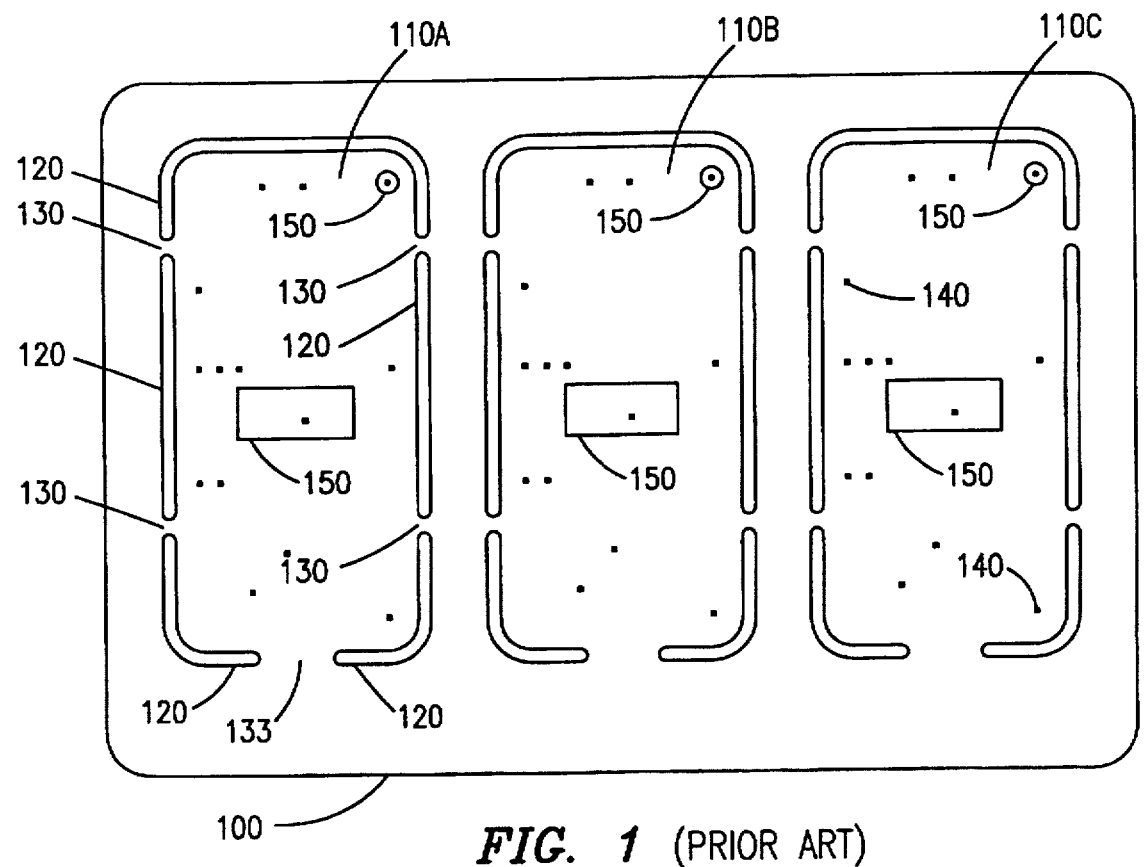
FIG. 1 is a top view of a manufacturing panel comprising three multi-layered printed circuit boards.

Referring now to FIG. 1 there is illustrated a top view of a manufacturing panel 100 comprising three multi-layered printed circuit boards 110A, 110B, and 110C. Each of the multi-layered printed circuit boards 110A–C are partially separated from the manufacturing panel by router cuts 120 along the periphery of the printed circuit boards. For example, printed circuit board 110A is separated from the manufacturing panel 100 by cuts 120. The printed circuit boards 110 are physically maintained as part of the manufacturing panel 100 by small routing tabs 130 comprising portions of the manufacturing panel which have not been routed away by the cuts 120. For example, printed circuit board 110A remains a part of the manufacturing panel 100 by small router tabs 130 and a slightly wider router tab 133.

Figure 2:
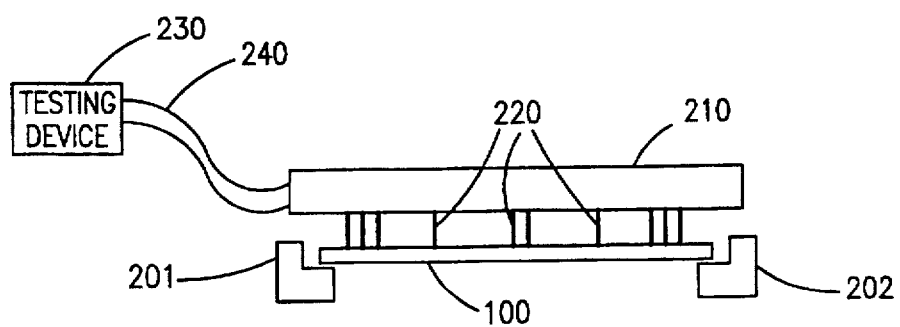
FIG. 2 is a cross-sectional view of a manufacturing panel held in place by conveyor rails during the testing process.

The current method for performing direct current and functional testing is to place test point pads 140 on the surface of a printed circuit board 110. These test point pads 140 are made of an electrically conductive material and are electrically connected to components and test circuitry 150 located on the printed circuit board 110 via electrical traces (not shown). The electrical traces are located on the top and bottom surface of the printed circuit board 110 and also run in between layers of the multi-layer printed circuit boards 110. Also located on the printed circuit boards 100 are test point pads 155 for performing radio frequency tests. Referring additionally now to FIG. 2, there is illustrated the manufacturing panel 100 during the testing process. During the manufacturing process the printed circuit boards 110 are populated with various components (not shown) on both sides of the printed circuit board. The manufacturing panel 100, holding the printed circuit boards 110A–C in place during the manufacturing and testing process, travels along an automatic conveyor/handler. The manufacturing panel 100 is held in place by conveyor rails 201 and 202. During the testing process, a test fixture 210 having a plurality of pressure pins 220, is placed over the manufacturing panel 100. As pressure is applied to the test fixture 210 toward the manufacturing panel 100 holding printed circuit boards 110A–C, electrical contact is made between the plurality of test points pads 140 and the test fixture 210 pressure pins 220. Each of the pressure pins 220 is electrically connected to a testing device 230 via a cable 240. The testing device 230 is thus electrically connected to the test circuitry located on the printed circuit boards 110 via the electrical cable, pressure pins 220, and test point pads 140.

Figure 3:
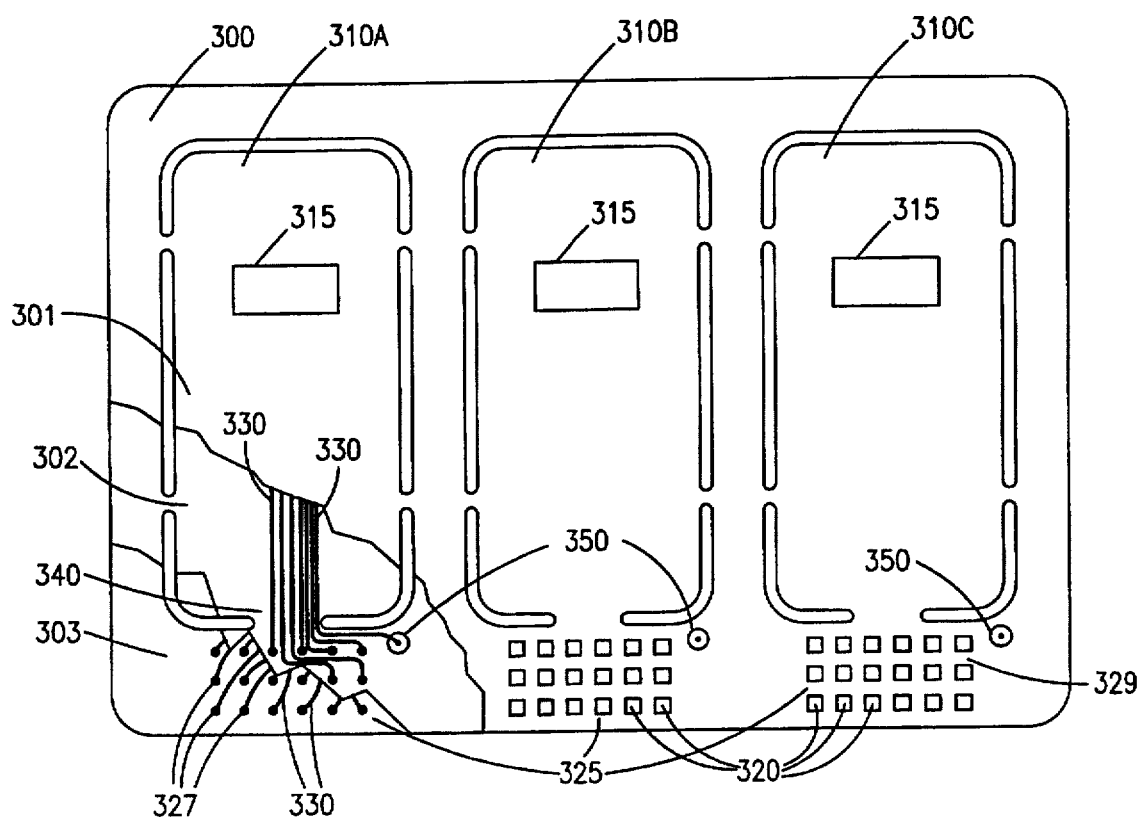
FIG. 3 is a top view of a partially broken away multilayer manufacturing panel including printed circuit boards in accordance with the present invention.

Referring additionally now to FIG. 3 there is illustrated a partially broken away top view of a multi-layer manufacturing panel 300 comprising three printed boards 310A, 310B, and 310C embodying the present invention. The manufacturing panel 300 is partially broken away to show a top layer 301, a second layer 302, and a third layer 303. Unlike the printed circuit boards 110A, 110B, and 110C of FIG. 1, the printed circuit boards 310A, 310B and 310C of FIG. 3 have no test point pads 140 located on the surface of the respective printed circuit boards. Instead, the test point pads 320 are located on the edge 325 of manufacturing panel 300. Each of the test point pads 320 are electrically connected to components and test circuitry 315 on the printed circuit boards 310 via electrical traces 330, which are routed through a slightly wider router tab 340, and vias 327, which conduct electrical signals between the various layers 301, 302, and 303. Also located on the edge 325 of the manufacturing panel 300 is radio frequency test point 350.

Figure 4:
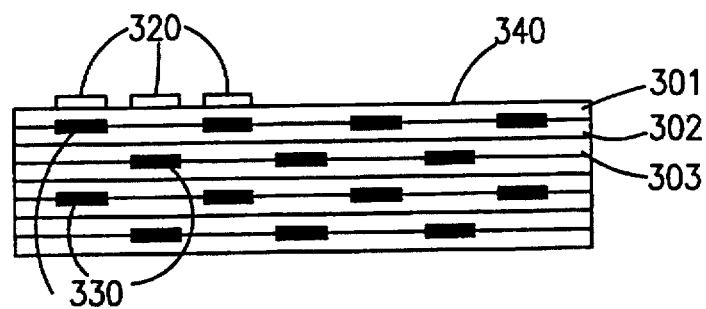
FIG. 4 is a cross-sectional view of a router tab showing electrical traces located on various layers of the router tab.

Referring additionally to FIG. 4 there is illustrated a cross-sectional view of router tab 340. The router tab 340 has multiple layers, including a top layer 301, a second layer 302 and a third layer 303. In a manufacturing panel 300 and printed circuit boards 310A–C combination practicing the present invention, the electrical traces 330 are routed between adjacent layers 302 and 303 of panel 300 and through the router tab 340 rather than on the top or bottom of the router tab 340. If the electrical traces 330 were to be routed on the surface 301 of the router tab 340, the traces 330 risk being torn and smeared into each other when the printed circuit board 310 is routed out of the manufacturing panel 300 at the end of the testing process. By routing the electrical traces 330 on alternating inner-layers, the risk of adjacent traces smearing and short circuiting to each other is reduced.

By placing test point pads 320 on the edge 325 of the manufacturing panel 300, the size of the test point pads 320 are no longer restricted since they are not competing for space with other components and electrical traces for printed circuit board surface area. The test point pads 320 can therefore, be made large enough to allow two pressure pins 220 of the test fixture 210 to make contact with each test point pad 320 thereby improving electrical contact reliability. At the same time, printed circuit board surface area is freed up to allow for the inclusion of additional circuitry. Furthermore, by placing the test point pads 320 on the edge 325 of the manufacturing panel 300, the conveyor rails 201 and 202 provide a solid backing for the manufacturing panel 300 and thereby eliminate bowing or flexing problems when pressure is applied to the test fixture 210 during the testing process. Still another advantage is that the test point pads 320 can be configured into a universal grid array 329 of FIG. 3. The universal grid array allows the location of the pressure points pads 320 to remain constant from one design to the next thereby eliminating the need to design, fabricate, and debug unique test fixtures 210 for each printed circuit board 110A–C design.

Figure 5:
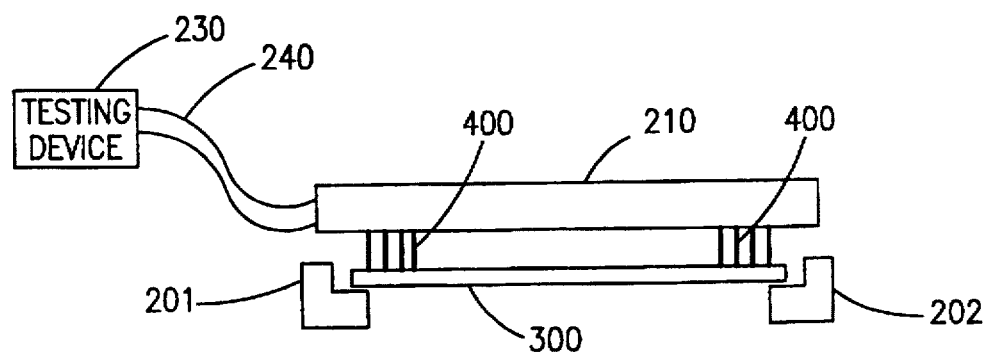
FIG. 5 is a cross-sectional view of a manufacturing panel in accordance with the present invention held in place by conveyor rails during the testing process.

Referring additionally to FIG. 5 there is illustrated a cross-sectional view of a manufacturing panel 300, in accordance with the present invention, held in place by conveyor rails 201 and 202. Unlike FIG. 2 where the pressure pins 220 are located throughout the test fixture 210 to contact with test pads 140 located on the printed circuit boards 110A–C, the pressure pins 400 are instead located on the edge of the test fixture 210 to contact with test pads 320 located on the edge 325 of manufacturing panel 300.

Although an embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. An apparatus for facilitating testing of a multi-layered printed circuit board comprising:

a plurality of test point pads located on the surface of a manufacturing panel; and a plurality of electrical traces originating from test circuits located on the printed circuit board, the electrical traces being routed from the printed circuit board to the manufacturing panel via router tabs between adjacent layers of the manufacturing panel, the electrical traces electrically connected to the plurality of test point pads for conducting electrical signals from the plurality of test point pads to the test circuits.

2. A manufacturing panel comprising:

a multi-layer printed circuit panel including at least one printed circuit board partitioned out of the panel by a plurality of router cuts and secured to the panel by a plurality of router tabs;

a plurality of test pads positioned along an edge of the panel; and a plurality of electrical traces extending between adjacent layers of the manufacturing panel for electrically connecting the test pads to test circuitry located on the printed circuit board.

* * * * *